United States Patent
Hsieh et al.

(10) Patent No.: US 7,382,028 B2
(45) Date of Patent: Jun. 3, 2008

(54) METHOD FOR FORMING SILICIDE AND SEMICONDUCTOR DEVICE FORMED THEREBY

(75) Inventors: Tung-Heng Hsieh, Hsinchu (TW); Chien-Li Cheng, Hsinchu (TW); Yi-Shien Mor, Hsinchu (TW); Yung-Shun Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 304 days.

(21) Appl. No.: 11/107,625

(22) Filed: Apr. 15, 2005

(65) Prior Publication Data

US 2006/0231910 A1  Oct. 19, 2006

(51) Int. Cl.
*H01L 29/423* (2006.01)
(52) U.S. Cl. ............... 257/385; 257/413; 257/E29.134
(58) Field of Classification Search ............... 257/249, 257/250, 385, 388, 413, 756, E29.134, E23.164
See application file for complete search history.

(56) References Cited

U.S. PATENT DOCUMENTS

| | | | |
|---|---|---|---|
| 4,479,831 A | 10/1984 | Sandow et al. | 148/1.5 |
| 4,682,407 A | 7/1987 | Wilson et al. | 29/576 |
| 5,441,904 A * | 8/1995 | Kim et al. | 438/592 |
| 5,652,156 A * | 7/1997 | Liao et al. | 438/161 |
| 6,069,061 A * | 5/2000 | Lin et al. | 438/517 |
| 6,150,251 A * | 11/2000 | Yew et al. | 438/592 |
| 6,242,333 B1 | 6/2001 | McNeil et al. | 438/592 |
| 6,350,677 B1 | 2/2002 | Ko et al. | 438/630 |
| 6,362,511 B1 * | 3/2002 | Mizushima et al. | 257/412 |
| 6,372,566 B1 | 4/2002 | Kittl et al. | 438/206 |
| 2001/0003378 A1 * | 6/2001 | Harada et al. | 257/726 |
| 2002/0086502 A1 | 7/2002 | Liu et al. | 438/530 |
| 2004/0023476 A1 * | 2/2004 | Ballantine et al. | 438/585 |
| 2004/0043624 A1 | 3/2004 | Tsai et al. | 438/745 |
| 2005/0101097 A1 * | 5/2005 | Shimamoto et al. | 438/332 |

OTHER PUBLICATIONS

"Comparative Study of Double Ion Implant Ti-salicide and Pre-amorphization Implant Co-salicide for Ultra-large-scale Integration Applications" Hung-Ming Chuang et al., Feb. 27, 2002, Semiconductor Sci. Technol. 17 (2002) 1075-1080.

* cited by examiner

*Primary Examiner*—Jennifer M Dolan
(74) *Attorney, Agent, or Firm*—Thomas, Kayden, Horstemeyer & Risley

(57) ABSTRACT

A method for forming silicide and a semiconductor device formed thereby. A Si-containing polycrystalline region is converted to an amorphous region, and annealed to form a regrown polycrystalline region having an increased grain size. A silicide layer is formed by reacting a metal and the regrown polycrystalline region having the increased grain size.

12 Claims, 4 Drawing Sheets

METHOD FOR FORMING SILICIDE AND SEMICONDUCTOR DEVICE FORMED THEREBY

BACKGROUND

The present invention relates in general to semiconductor processing methods for forming silicide. More particularly, it relates to a method for forming silicide over silicon-containing areas in a semiconductor device and a semiconductor device formed thereby.

As integration of elements in integrated circuits (IC) increases, line widths and geometries for semiconductor devices are reduced. Nevertheless, resistance of a source/drain region in metal oxide semiconductor (MOS) transistors increases, and the polysilicon electrodes that form the MOS gates and wiring lines within semiconductor devices introduce undesirable resistance. To reduce resistance and RC delay time to improve the operating speed of a device, a silicide layer is employed. Thereby, a response time and operating speed of the entire device is increased.

A typical implementation of a silicide layer on a polysilicon electrode or a silicon substrate is known as a self-aligned silicide (salicide) process. Titanium silicide ($TiSi_2$) is commonly used as a salicide material. One problem in forming salicide having line widths less than about 0.5 μm is the tendency of titanium silicide to agglomerate when forming overlying gate, source, and drain regions and subjected to high annealing temperatures, typically using a rapid thermal anneal (RTA). For example, in the formation of titanium silicide, typically a two-step process is required to form the low electrical resistance phase of titanium silicide, frequently requiring annealing temperatures of up to 800° C. In smaller line width areas, the titanium silicide has difficulty achieving the nucleation and growth of the crystalline phase required for low electrical resistance, requiring higher annealing temperatures which frequently causes agglomeration of the silicide. This effect is referred to as the narrow line effect. Cobalt silicide ($CoSi_2$) is a preferred material for forming salicide for sub-quarter micron devices since the required phase transformation to form the low electrical resistance crystalline phase takes place at lower temperatures, for example, from about 700° C. to about 900° C., avoiding silicide agglomeration. Nevertheless, the inventors have encountered problems of poor resistance uniformity over the process wafer when forming cobalt silicide on P-type polysilicon, which sometimes results in out of specification sheet resistance over a large percentage of the silicided wafer area.

An improved method for forming low resistance salicide over sub-quarter micron semiconductor devices with reliable and uniform electrical behavior is thus called for.

SUMMARY

According to one aspect of the invention, a method for forming silicide over a silicon-containing area is provided. An exemplary method comprises providing a Si-containing polycrystalline region having a Si grain size; converting the Si-containing polycrystalline region into a Si-containing amorphous region; annealing the Si-containing amorphous region to form a regrown polycrystalline region having an increased Si grain size; and forming a silicide layer by reacting a metal and the regrown polycrystalline region having the increased Si grain size.

According to another aspect of the invention, a semiconductor device is provided. An exemplary semiconductor device comprises a Si-containing polycrystalline layer having a larger grain size at an upper portion than at a lower portion; and a silicide layer on the Si-containing polycrystalline layer.

BRIEF DESCRIPTION OF THE DRAWINGS

For a better understanding of the present invention, reference is made to a detailed description to be read in conjunction with the accompanying drawings, in which.

REFERENCE NUMERALS IN THE DRAWINGS

Figure 1:
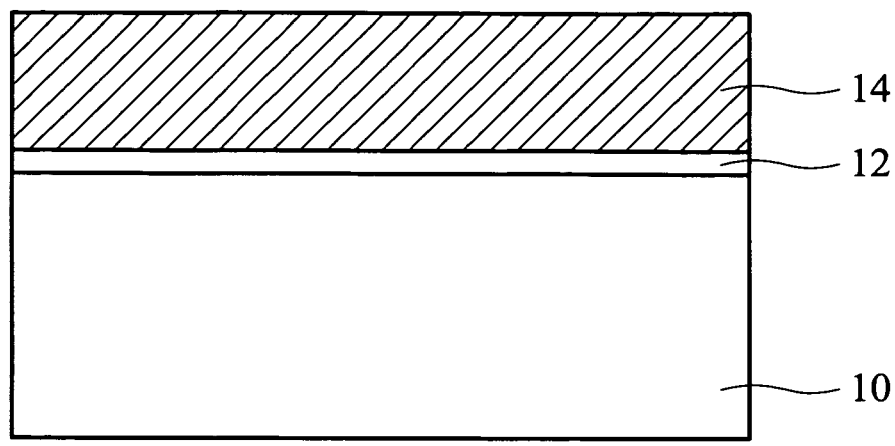
FIGS. 1 to 6 are cross-sections of an embodiment of a method of forming a silicide layer on a MOS transistor.
Figure 2:
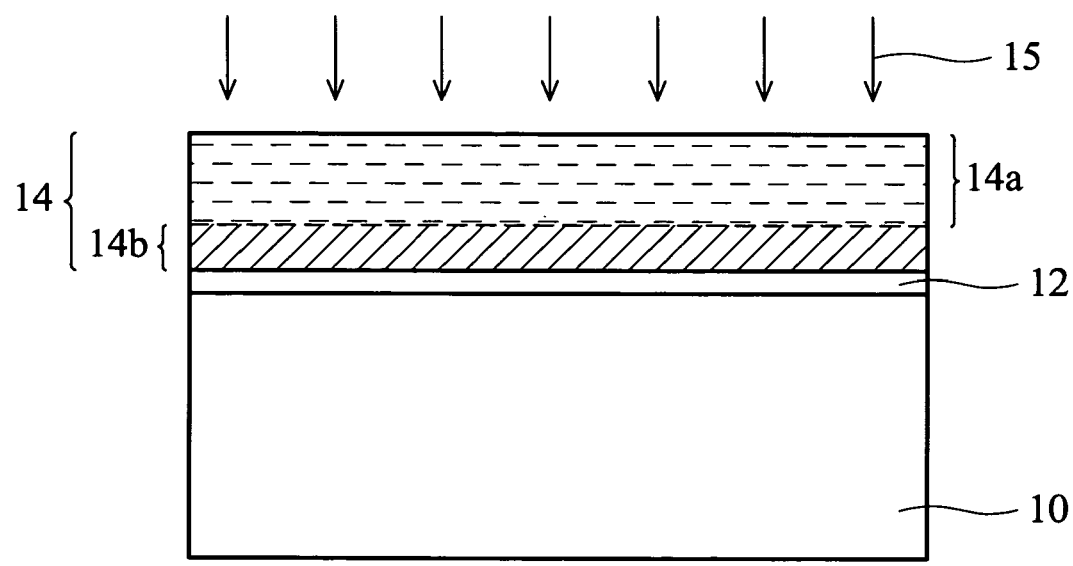

10 semiconductor substrate
12 gate-dielectric layer
14 polysilicon layer
15 pre-amorphization implant
16 lightly doped source/drain region
18 spacer
20 heavily doped source/drain region
22 source/drain region
24 metal layer
26 cap layer
28 silicide layer
G gate electrode

DESCRIPTION

A method for forming silicide in a semiconductor device will be described here in greater detail. Some embodiments of the invention, such as the exemplary embodiments described, can potentially provide silicides with more uniform sheet reisistance over a semiconductor process wafer. This and other advantages may be accomplished by forming larger polycrystalline grain to facilitate the subsequent silicide formation.

In the following, illustrative embodiments of the invention are described by referring to formation of silicide over a silicon-containing region of a field effect transistor. It will be appreciated, however, that the invention is applicable to any silicon-containing region provided in an integrated circuit, for example, polysilicon lines for connecting individual semiconductor elements. It will be further appreciated that although the method of the invention is advantageously used to the formation of cobalt silicide on a PMOS transistor, it is applicable to formation of other metal silicides on NMOS or any silicon-containing regions.

Referring now to the drawings, FIGS. 1 through 6 are schematic cross-sections of an embodiment of a method for forming silicide in a field effect transistor. In FIG. 1, a gate dielectric layer 12 and a polysilicon layer 14, later to be formed into a gate electrode, are sequentially formed on a semiconductor substrate 10. The semiconductor substrate 10 may be silicon, strained silicon, silicon germanium (SiGe), silicon on insulator (SOI), or other suitable materials. The gate dielectric layer 12 may comprise oxide, nitrided oxide, nitride, high dielectric constant (k) dielectrics such as such as $Y_2O_3$, $La_2O_3$, $Al_2O_3$, $ZnO_2$, $HfO_2$, or other suitable materials. It is to be appreciated that the polysilicon layer 14 can be a doped or undoped polysilicon layer, a poly-SiGe layer, or any other polycrystalline layer comprising Si.

Next, as an important feature of the invention, a pre-amorphization implant (PAI) 15 is performed on the polysilicon layer 14 to cause at least an upper portion thereof to convert into an amorphous region 14a. Preferably, the pre-amorphization implant 15 is performed by ion implanting a dopant not smaller than Si atom. Suitable dopants include but are not limited to Ge, Ar, Si, and Xe. To avoid introduction of dopant or other defects and damage to the active regions of the device, it is preferable that the PAI is effected at such an energy that an implantation profile thus produced not extend beyond the gate dielectric layer 12. Accordingly, the implant dosage and energy of the PAI may vary depending on the thickness of the polysilicon layer 14. In general, the dosage may range between $10^{13}$ and $10^{17}$ ions/cm$^2$ and the energy may range between 20 and 100 keV, depending on implant source. For example, for the polysilicon layer 14 having a thickness of about 800-2000 Å, the PAI may be effected by implanting Ge in a dose of about $10^{14}$ to $10^{16}$ at an energy of about 50 to 90 keV. Those of skill in the art understand that different doses and energies can be employed depending upon the desired depth and location of the peak of the implanted distribution. Preferably, an amorphous region 14a is formed such that a thickness ratio to the underlying polysilicon layer 14b of about 5:5 to 8:5, more preferably about 7:5.

Figure 3:
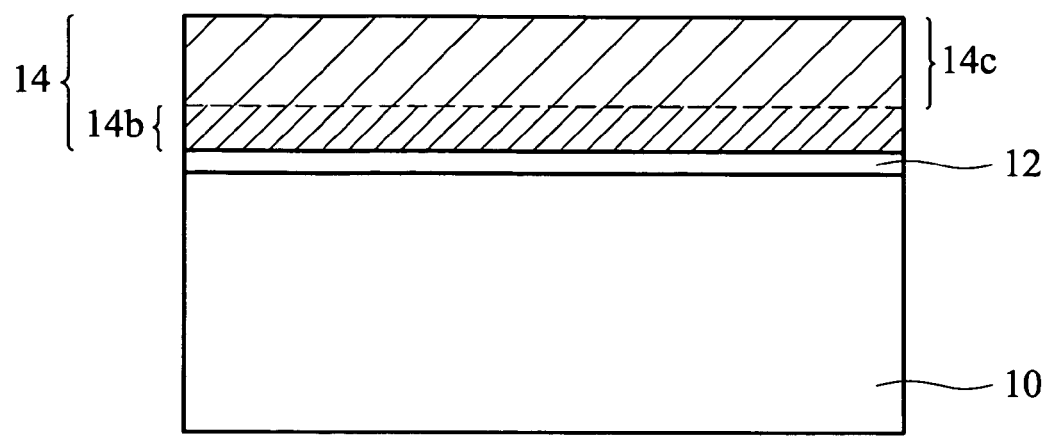

Referring to FIG. 3, as another important feature of the invention, the amorphous region 14a is annealed to form a regrown polysilicon region 14c having an increased grain size to facilitate the silicide formation in the subsequent process. The inventors have found that the silicide formation is strongly correlated with the grain size. According to the study of the inventors, the silicide film formed by larger polycrystalline grain may show superior sheet resistance uniformity and smoother morphology. The PAI is known in the art to increase the number of the nucleation sites to improve the quality of the subsequently formed silicide; for examples, see U.S. Pat. Nos. 6,350,677, 6,372,566, and 6,242,333. Nevertheless, a PAI accompanying a subsequent annealing to increase the grain size to facilitate the formation of silicide is not addressed.

The anneal of the amorphous region 14a may be accomplished by rapid thermal anneal (RTA), laser anneal, or furnace anneal. For example, the anneal may be a rapid thermal anneal (RTA) at about 700 to 800° C. for about 20 to 60 minutes, in an inert ambient of argon, helium, or nitrogen. In addition, provided that the polysilicon layer is undoped, an ion implantation may be performed before the anneal to substantially enhance the conductivity of the polysilicon. Well known conductivity imparting dopants used in silicon include P type dopants such as B, Al, Ga, In, and N type dopants such as P, As, Sb.

Figure 4:
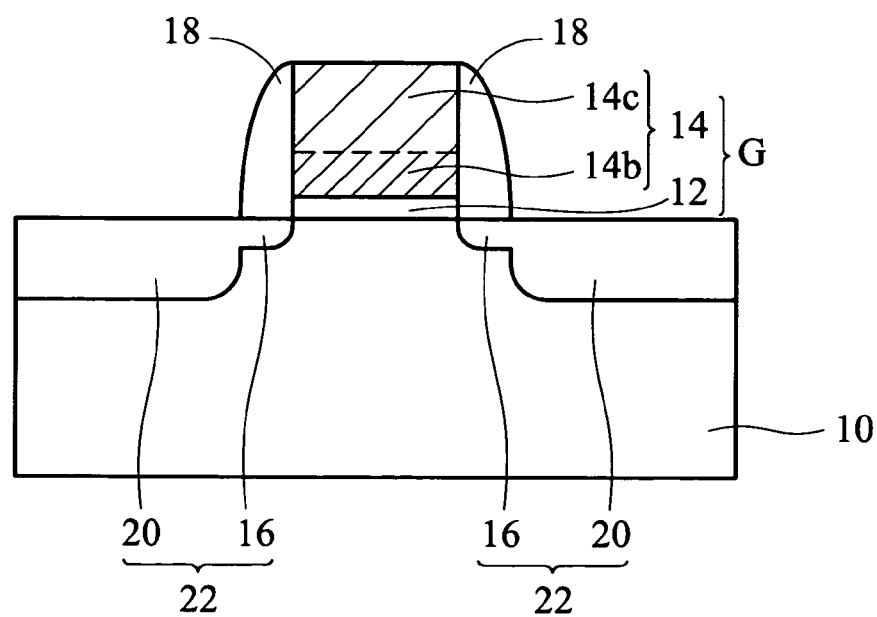

Next, referring to FIG. 4, the polysilicon layer 14 with the regrown polysilicon region 14c and the gate dielectric layer are patterned to form a gate electrode by known lithography technology and etching methods. Subsequently, a pair of source/drain regions 22 is formed by known methods to complete a MOS transistor. For example, a lightly doped source/drain region 16 can be formed in the substrate 10 by an ion implantation process using the gate G as an implant mask. A spacer such as a nitride, oxide, or composite spacer 18 is formed on sidewalls of the gate G. The spacer 18 and the gate G serve as an implant mask, and a heavily doped source/drain region 20 is formed in the substrate 10 by ion implantation. The lightly doped source/drain region 16 and the heavily doped source/drain region 20 constitute a source/drain region 22. Conventionally, a PAI is performed at this stage, i.e., after a MOS transistor is built, to bombard the surface of the polysilicon gate to increase the number of the nucleation sites. Conversely, as described previously, since a substantial portion of the polysilicon 14 is to be converted to an amorphous state, the PAI 15 of the invention may require a higher level of energy advantageously performed before the patterning of the gate electrode G to avoid damage to the substrate 10.

Figure 5:
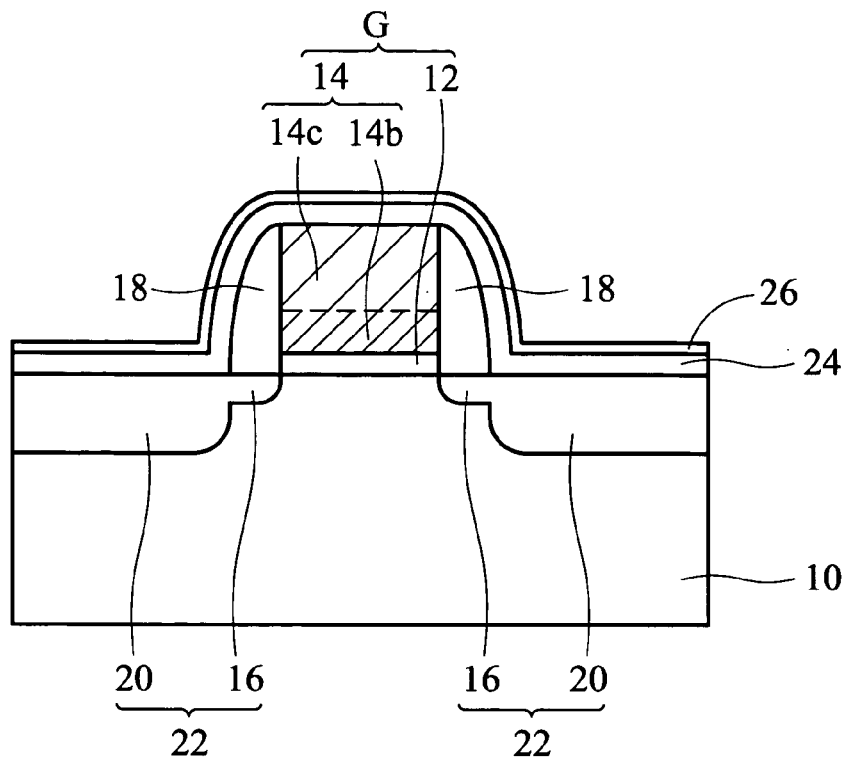

Referring now to FIG. 5, a conformal metal layer 24 is deposited over the substrate 10 by, for example, sputtering. The metal layer 24 may be a material such as Co, Ti, W, Ni, Mo, Ta, or Pt, although Co is particularly preferred. On the metal layer 24, a cap layer 26 is preferably formed and may typically comprise Ti or TiN, when the metal layer 24 is substantially formed of cobalt. The cap layer 26 is typically formed by sputtering.

Figure 6:
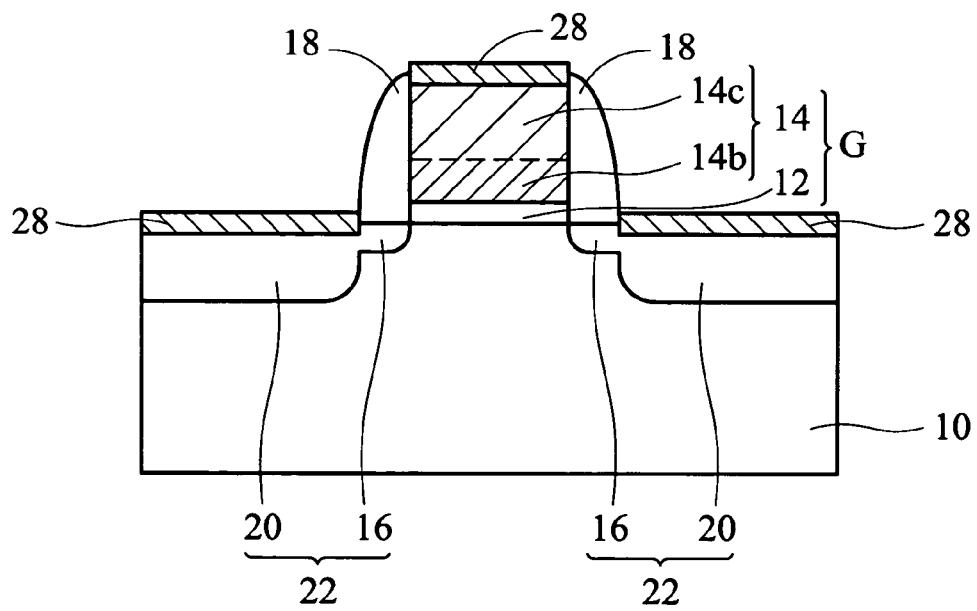

Thereafter, a first anneal step, typically at about 440-600° C. for cobalt as the metal layer 24, is performed to initiate a reaction between the metal and the silicon in the regrown polysilicon region 14c to form a silicide layer 28 as shown in FIG. 6. It should be noted that a corresponding reaction, of course, also takes place in the source/drain region 22. During this first annealing step, the cap layer 26 acts as a so-called gettering layer reducing oxidation of the underlying metal, which could otherwise increase the resistance of the finally obtained silicide layer.

Subsequently, the cap layer 26 and the non-reacted metal layer 24 are removed by selective wet etching to produce the structure shown in FIG. 6. Next, a second annealing step is carried out at a higher temperature than the first annealing step, typically in the range of 700-900° C., if cobalt has been used, to transform the silicide layer 28 from a high resistance state to a low resistance state.

Still referring to FIG. 6, a MOS transistor thus formed comprises a silicided gate electrode G, and a pair of source/drain regions 22 in the substrate 10 oppositely adjacent to the gate electrode G. The silicided gate electrode comprises a silicide layer 28 on a polysilicon layer 14, which may be poly-SiGe or other Si-containing polycrystalline material. The upper portion 14c has a larger grain size than the lower portion 14b. Preferably, the thickness ratio of the upper portion 14c to the lower portion 14b is about 5:5 to 8:5. The silicide layer may comprise $CoSi_2$, $TiSi_2$, $WSi_2$, $NiSi_2$, $MoSi_2$, $TaSi_2$, or PtSi although $CoSi_2$ is particularly preferred. The gate electrode G may comprise a P-type or N-type dopant and the upper portion thereof may comprise a dopant of at least one of Ge, Ar, Si, and Xe.

Figure 7:
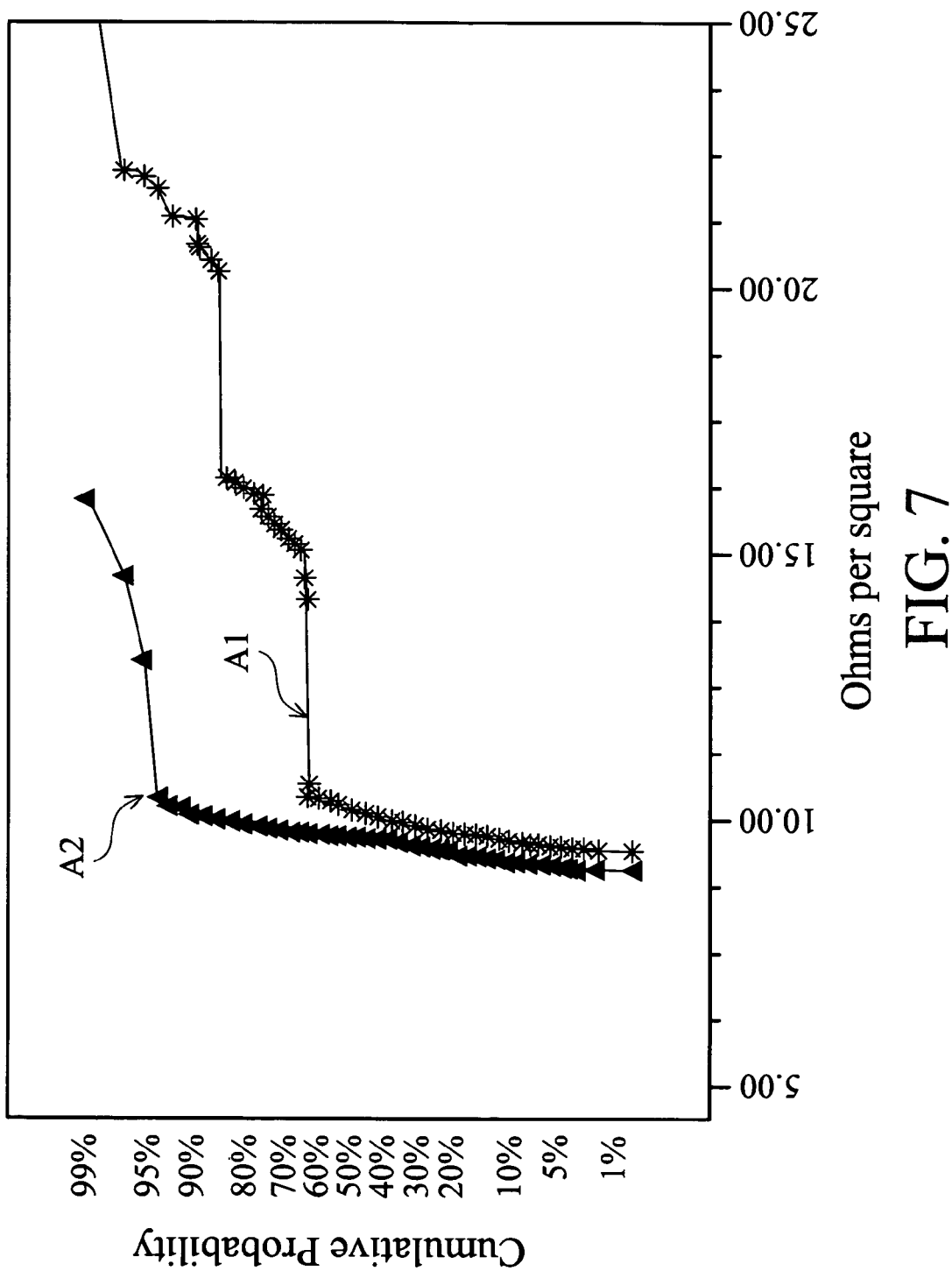
FIG. 7 is a cumulative distribution graph of sheet resistance measurements over a process wafer surface taken following a conventional silicide method and a silicide method according to an embodiment of the invention.

By forming silicide from larger polysilicon grains, sheet resistance (Rs) of the silicides, for example cobalt silicide, is improved. In addition, the distribution of sheet resistance values over measured areas of the wafer show a greatly reduced distribution tail as indicated in a cumulative distribution analysis to represent a larger number of measurements over various areas of a process wafer. For example, FIG. 7 shows an exemplary cumulative distribution graph of a series of sheet resistance measurements taken over an exemplary wafer according to methods commonly used in the art, for example, a Van der Pauw four probe method. The vertical axis shows the cumulative percent of sheet resistance measurements below a sheet resistance value of the horizontal axis in ohms/square. In FIG. 7, A1 represents sheet resistance distributions of cobalt silicides over a P doped polysilicon using conventional methods, i.e., without the PAI and anneal treatment on the polysilicon. It can be seen that a significant distribution tail occurs for resistances greater than about 10 ohms/square whereas sheet resistance values less than about 10 ohms/square occurs for only about 70% of the cumulative measurements. In contrast, A2 shows sheet resistance distributions of cobalt silicides over a P doped polysilicon according to a preferred embodiment of the invention, showing a significantly reduced sheet resistance distribution tail where about 96% of the cumulative measurements are less than about 10 ohms/square. As a result, the silicide method according to preferred embodiments provides more reliable and uniform sheet resistance over a larger portion of the process wafer.

While the invention has been described by way of example and in terms of preferred embodiment, it is to be understood that the invention is not limited thereto, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate;
    a MOS transistor on the substrate comprising a gate and a pair of source/drain regions, wherein the gate comprising a Si-containing polycrystalline layer has a larger grain size in an upper portion than in a lower portion, wherein the gate comprises a P-type or N-type dopant and the upper portion comprises a dopant of at least one of Ar, and Xe; and
    a silicide layer on the gate.

2. The device of claim 1, wherein the MOS transistor is a P-MOS transistor.

3. The device of claim 1, wherein the thickness ratio of the upper portion to the lower portion is about 5:5 to 8:5.

4. The device of claim 1, wherein the Si-containing polycrystalline layer comprises a polysilicon layer.

5. The device of claim 1, wherein the Si-containing polycrystalline layer comprises a poly-SiGe layer.

6. The device of claim 1, wherein the silicide layer comprises $CoSi_2$, $TiSi_2$, $WSi_2$, $NiSi_2$, $MoSi_2$, $TaSi_2$, or $PtS_i$.

7. The device of claim 1, wherein the silicide layer is $CoSi_2$.

8. The device of claim 1, further comprising a cap layer on the silicide layer.

9. A semiconductor device, comprising:
    a Si-containing polycrystalline layer having a larger grain size in an upper portion than in a lower portion, wherein the upper portion comprises a dopant of at least one of Ar, and Xe; and
    a silicide layer on the Si-containing polycrystalline layer.

10. The device of claim 9, wherein the Si-containing polycrystalline layer comprises a polysilicon layer.

11. The device of claim 9, wherein the Si-containing polycrystalline layer comprises a poly-SiGe layer.

12. The device of claim 9, wherein the silicide layer comprises $CoSi_2$, $TiSi_2$, $WSi_2$, $NiSi_2$, $MoSi_2$, $TaSi_2$, or PtSi.

* * * * *